United States Patent
Horng et al.

(10) Patent No.: US 7,523,551 B2
(45) Date of Patent: Apr. 28, 2009

(54) MANUFACTURING METHOD OF A MULTI-LAYER CIRCUIT BOARD EMBEDDED WITH A PASSIVE COMPONENT

(75) Inventors: Ching-Fu Horng, Kaohsiung (TW); Yung-Hui Wang, Kaohsiung (TW)

(73) Assignee: Advanced Semiconductor Engineering, Inc., Kaohsiung (TW)

( * ) Notice: Subject to any disclaimer, the term of this patent is extended or adjusted under 35 U.S.C. 154(b) by 150 days.

(21) Appl. No.: 11/182,743

(22) Filed: Jul. 18, 2005

(65) Prior Publication Data

US 2006/0059682 A1    Mar. 23, 2006

(30) Foreign Application Priority Data

Sep. 21, 2004  (TW) ............................... 93128635 A

(51) Int. Cl.
*H01R 43/00* (2006.01)
(52) U.S. Cl. .............................. 29/854; 29/857; 29/846; 29/876; 361/761; 361/760; 361/767
(58) Field of Classification Search ................. 361/761, 361/313, 314, 315, 320, 328, 763, 766, 821, 361/764, 760, 738, 735, 748–751, 762, 765, 361/767, 768, 790–795, 808, 811; 29/832, 29/830, 836, 840, 854, 857, 846, 874, 876; 438/106
See application file for complete search history.

(56) References Cited

U.S. PATENT DOCUMENTS

| 6,097,089 | A | * | 8/2000 | Gaku et al. | .................. 257/712 |
| 6,734,542 | B2 | * | 5/2004 | Nakatani et al. | ............. 257/687 |
| 7,134,195 | B2 | * | 11/2006 | Sunohara et al. | .............. 29/832 |
| 2003/0127727 | A1 | * | 7/2003 | Suehiro et al. | .............. 257/712 |
| 2004/0212969 | A1 | * | 10/2004 | Imamura et al. | ............ 361/760 |
| 2005/0211465 | A1 | * | 9/2005 | Sunohara et al. | ............ 174/260 |

* cited by examiner

*Primary Examiner*—Dean A. Reichard
*Assistant Examiner*—Hoa C Nguyen

(74) *Attorney, Agent, or Firm*—Bacon & Thomas, PLLC

(57) ABSTRACT

A manufacturing method of a multi-layer circuit board embedded with a passive component includes the steps of: providing a conductive foil which has one or more pairs of metal protruding points; connecting a passive element to the corresponding metal protruding points; providing a board having a core substrate with organic insulation layer on a core substrate; stacking the conductive foil and the board, wherein the passive component is embedded in the organic insulation layer and patterning on the conductive foil.

15 Claims, 5 Drawing Sheets

MANUFACTURING METHOD OF A MULTI-LAYER CIRCUIT BOARD EMBEDDED WITH A PASSIVE COMPONENT

This application claims the benefit of Taiwan application Serial No. 93128635, filed Sep. 21, 2004, the subject matter of which is incorporated herein by reference.

BACKGROUND OF THE INVENTION

1. Field of the Invention

The invention relates in general to a manufacturing method of a multi-layer circuit board, and more particularly to a manufacturing method of a multi-layer circuit board embedded with a passive component.

2. Description of the Related Art

The object of creating a larger space within a substrate area with limited space and enhancing the multi-functions of the module is normally achieved by reducing or embedding a passive component so that more space can be used for the installation of active components. And, the multi-layer circuit board embedded with a passive component is thus invented and provided. The above passive component can be components such as a resistor, a capacitor, an inductometer or a voltage controlled quartz oscillator.

Many methods can be used to integrate several film passive components in a multi-layer circuit board. In terms of the manufacturing process of multi-layer circuit board, the key factor lies in the ability of embedding the thick-film or thin film passive component of the kind in the circuit board during manufacturing process. The key factor is how to maintain the electrical precision of the thin film passive component and reduce the variation with the original design after the thin film passive component is integrated into the multi-layer circuit board. An exemplified in Taiwanese Patent Publication No. 518616 "Manufacturing Method of a Multi-Layer Circuit Board with a Passive Component" disclosed on Jan. 21, 2003 is an example focusing on this issue.

Referring to FIG. 1A and FIG. 1B, a multi-layer circuit board with a passive component includes a circuit thin plate 1 whose surface has a patterned circuit layer 2, a conductive foil 3, a resistor film 5, a passivation layer 7, and a prepreg 9. The resistor film 5 is deposited on a slightly rough region on a smooth surface of the conductive foil 3 to have a better adhesion, and can be appropriately heated to become solidification. The slightly rough region can be defined according to photoresist micro-film etching, polishing, or other methods. The passivation layer 7 covers up the resistor film 5. The prepreg 9 is located between the conductive foil 3 and the circuit thin plate 1. The circuit thin plate 1, the conductive foil 3, and the prepreg 9 are stacked together according to a hot-pressing step.

However, the above methods must take into account the manufacturing process ability of the resistor or capacitor. For example, the printing area of the resistor must be carefully controlled, lest the printed resistor might vary with the designed value and cause bias to electrical precision. Therefore, the entire manufacturing process would become more complicated.

In the fields of close-to-mature technology, how to maintain the electrical precision and at the same time simplify the manufacturing process for the current manufacturing process to better fit the needs of next generation products has become an urgent issue to be resolved.

SUMMARY OF THE INVENTION

It is therefore a main object of the invention to provide a manufacturing method of a multi-layer circuit board embedded with a passive component, which can simplify manufacturing process and enhance electrical precision.

Another object of the invention is to provide a manufacturing method of a multi-layer circuit board embedded with a passive component without considering the manufacturing process ability of the resistor or capacitor as well as the variation between the formed components and their original designed values.

The other object of the invention is to provide a manufacturing method of a multi-layer circuit board embedded with a passive component such as a resistor, a capacitor, or an inductometer.

In order to achieve the above object, the invention discloses a manufacturing method of a multi-layer circuit board embedded with a passive component. The method includes the following steps of providing a conductive foil which has a first surface and a second surface and has at least a pair of metal protruding points; mounting a passive component onto corresponding metal protruding points; providing a board having a core substrate with organic insulation layer thereon; stacking the conductive foil and the board, wherein the passive component is embedded in the organic insulation layer; and patterning the conductive foil to form an electrical pattern on the conductive foil.

The organic insulation layer is located between conductive foil and the core substrate.

Besides, at least a through hole can be formed on the core substrate to be electrically connected to the conducting circuit on the conductive foils of the top and the bottom surface of the core substrate.

Further, the core substrate with surface circuit can be formed on the blind hole on the insulation layer for the circuit pattern on the conductive foil to be electrically connected to the conducting circuit on the surface of the core substrate to form a multi-layer circuit board.

Moreover, the multi-layer circuit board can be a structure having a blind hole, a structure having a through hole, or a structure having a blind hole connected with a buried hole.

The characteristics and features of the invention are disclosed in the embodiments below, so that anyone who is skilled in relevant technology will be able to understand and implement the technology of the invention accordingly. Any features and object relevant to the invention can be easily understood from the embodiments, claims and drawings disclosed the invention.

The summary of the invention disclosed above and the embodiments of the invention disclosed below exemplify and explain the principles of the invention and provide further explanations to the claims of the invention.

Other objects, features, and advantages of the invention will become apparent from the following detailed description of the preferred but non-limiting embodiments. The following description is made with reference to the accompanying drawings. Anyone who is skilled in related technology would be able to understand and implement the technology accordingly.

DETAILED DESCRIPTION OF THE INVENTION

It is noteworthy that the following drawings are not formulated according to actual scale, but are merely formulated for elaboration. That is, the actual scales and features in various layers of the multi-layer circuit board are not fully reflected.

Referring to FIG. 2A to FIG. 2D, cross-sectional views of the manufacturing process of a multi-layer circuit board embedded with a passive component according to a preferred embodiment of the invention are shown.

Figure 1A:
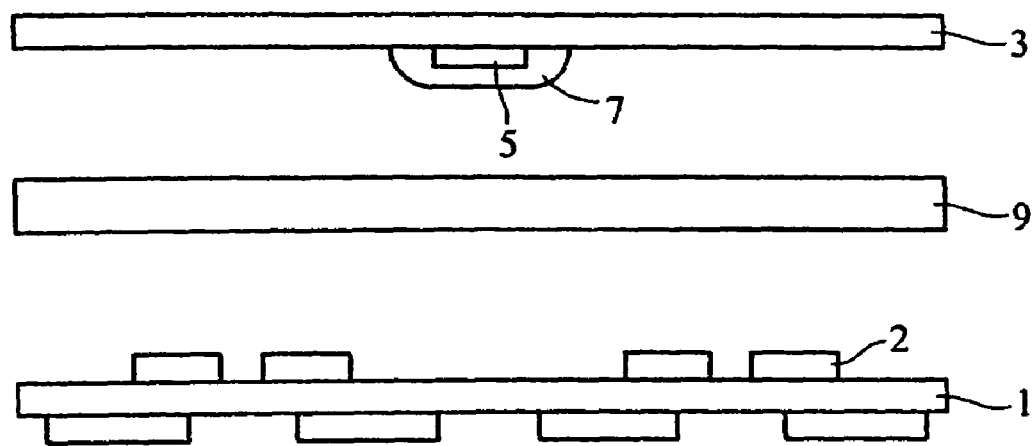
FIG. 1A and FIG. 1B (Prior Art) are cross-sectional views of the manufacturing process of a conventional multi-layer circuit board embedded with a passive component.
Figure 1B:
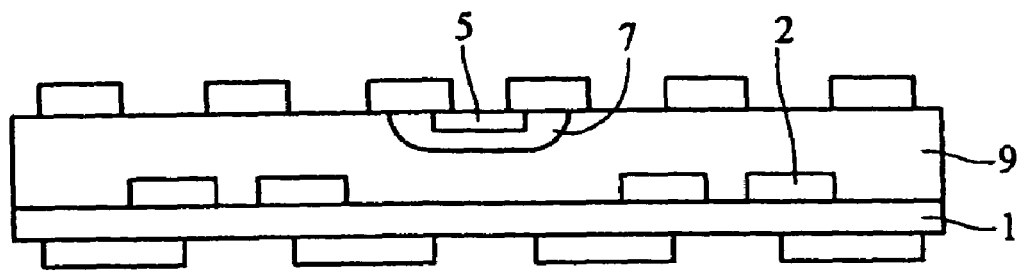
Figure 2A:
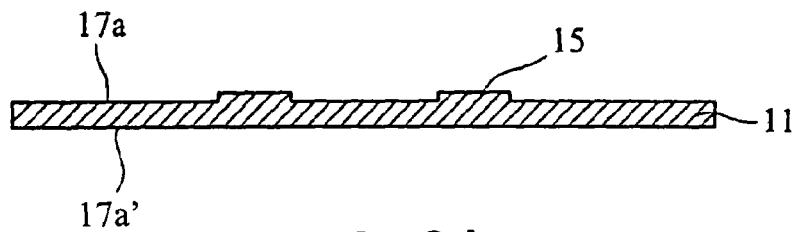
FIG. 2A to FIG. 2D are cross-sectional views of the manufacturing process of a multi-layer circuit board embedded with a passive component according to a preferred embodiment of the invention.

As shown in FIG. 2A, at first a conductive foil 11 having at least a pair of metal protruding points 15 is provided on a first surface 17a. The conductive foil 11 having at least a pair of metal protruding points 15 disclosed above can be procured from external sources by the manufacturer or obtained through a patterning manufacturing process such as the micro-film etching manufacturing process to pattern a conductive foil so to form the metal protruding points 15 on a surface of the conductive foil, as a result of the protruding points 15 with the same material as the conductive foil. The conductive foil 11 can be made of copper, silver, aluminum, palladium or silver palladium, and is preferably made of a copper foil.

Figure 2B:
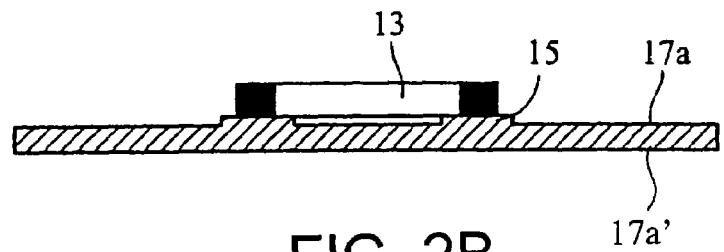

As shown in FIG. 2B, a passive component 13 is coupled to corresponding metal protruding points 15 on the first surface 17a of the conductive foil 11a. The step of coupling can be performed by hot-pressing for instance. During the hot-pressing process, alignment precision is essential and must be under good control. The above passive component 13 can be a capacitor, a resistor, or an inductometer.

Figure 2C:
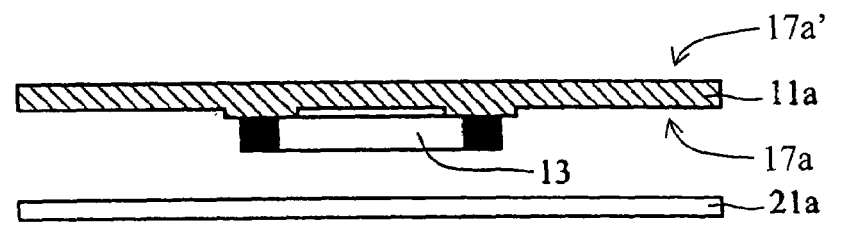
Figure 2C:
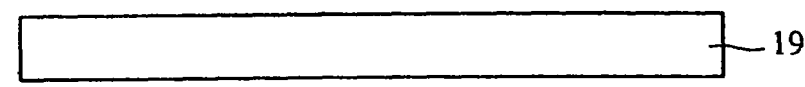
Figure 2C:
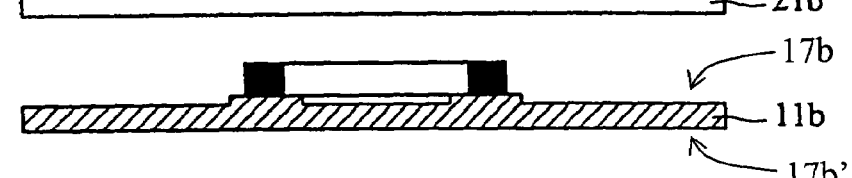

FIG. 2C shows a core substrate 19, a first organic insulation layer 21a and a second organic insulation layer 21b, a first conductive foil 11a having a passive component 13, and a second conductive foil 11b with or without a passive component.

The first organic insulation layer 21a and the second organic insulation layer 21b are pressed onto the two lateral sides of the core substrate at the same time first, and a first conductive foil 11a and a second conductive foil 11b are pressed onto the first organic insulation layer 21a and the second organic insulation layer 21b at the same time. Alternatively, the first organic insulation layer 21a, the first conductive foil 11a, the second organic insulation layer 21b, and the second conductive foil 11b are respectively located on the two lateral sides of the core substrate 18, and then the layers and foils are pressed at the same time. It is permitted to press the first organic insulation layer 21a and the first conductive foil 11a on one side of the core substrate, and not any other single layer plate and conductive foil is pressed on the other side of the core substrate.

The first surface (17a, 17b) of the conductive foil (11a, 11b) on which the passive component 13 is disposed comes into contact with the organic insulation layer. The organic insulation layer (21a, 21b) can be a prepreg or a liquid resin pasted on the surface of the core substrate 19. The core substrate 19 can be a metal circuit with patterns on both of the two surfaces or a simple core substrate without any patterns. The core substrate 19 can be made of insulated organic material or ceramic material, such as epoxy resin, polyimide, dimaleate-polyimide resin, or other fiberglass composites such as a conventional FR-4 substrate. The FR-4 substrate can be made of epoxy resin, a fiberglass cloth and an electroplated copper foil for instance. The core substrate 19 is not limited to be made of a single organic material. The core substrate 19 can be composed of various insulation layers as well. The above stacking procedure can be achieved via a hot-pressing step in which alignment precision is essential and must be under good control.

Figure 2D:
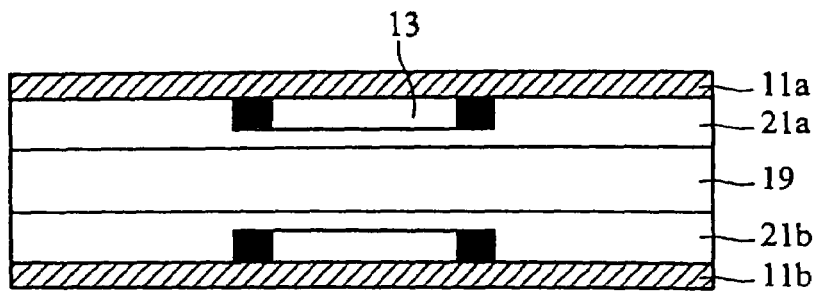

As shown in FIG. 2D, the layers of the multi-layer circuit board 23 deposited through stacking procedure, from top to down, include the first conductive foil 11a with the passive component 13, the first organic insulation layer 21a, the core substrate 19, the second organic insulation layer 21b, the second conductive foil 11b or the second conductive foil 11b with the passive component 13.

Figure 3A:
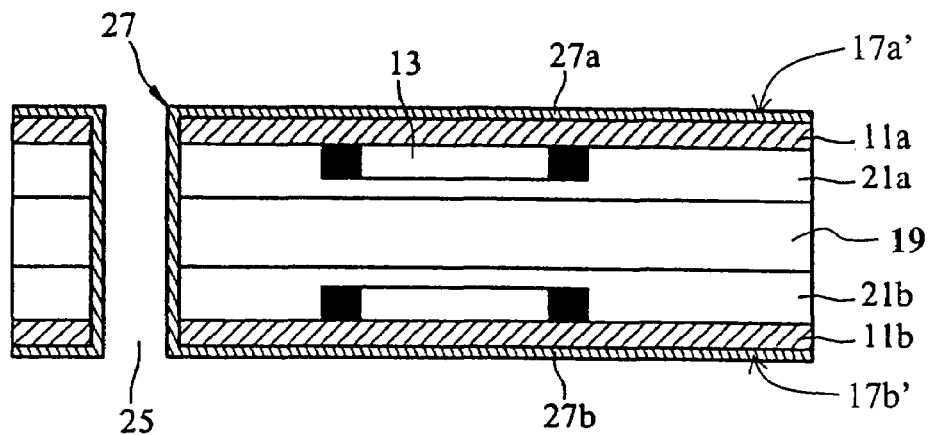
FIG. 3A and FIG. 3B show a first example of a circuit pattern formed on the surface of a deposited multi-layer circuit board.
Figure 3B:
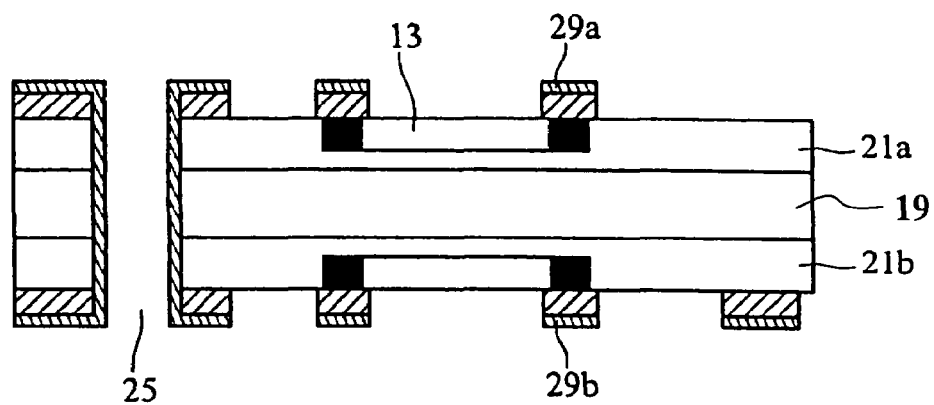

Refer to FIG. 3A and FIG. 3B, which show a first example of a circuit pattern formed on the surface of a deposited multi-layer circuit board.

In FIG. 3A, at least a through hole 25 is formed through penetrating the first conductive foil 11a and the second conductive foil 11b, so that the circuits formed on the first conductive foil 11a and the second conductive foil 11b afterwards can be electrically connected via the through holes 25. Next, a metal layer 27 is formed on the wall of the hole to enable hole connection. The metal layers (27a, 27b) are respectively formed on the second surface 17a' of the first conductive foil 11a and the second surface 17b' of the second conductive foil 11b to enable the formation of an electrical pattern. The metal layer 27 may includes copper.

The formation of the metal layer 27, for example the formation method of a copper metal layer, can be achieved through chemical vapor deposition such as physical vapor deposition (PVD), chemical vapor deposition (CVD), electroplated copper, non-plated copper, sputtering, evaporation, arc vapor deposition, ion beam sputtering, laser ablation deposition, plasma enhanced chemical vapor deposition (PECVD) or organic metal. It is preferred to use non-plating method first and the plating method comes second in forming the copper metal layer.

The metal layer (27a, 27b) on the top and the bottom surfaces as well as the conductive foil (11a, 11b) shown in FIG. 3A are patterned to form the electrical patterns (29a, 29b) in FIG. 3B respectively. The above method of patterning the metal layers 27 form the electrical patterns (29a, 29b) respectively can be achieved through the manufacturing process of plating the through hole, such as the subtractive approach using the panel.

Figure 4A:
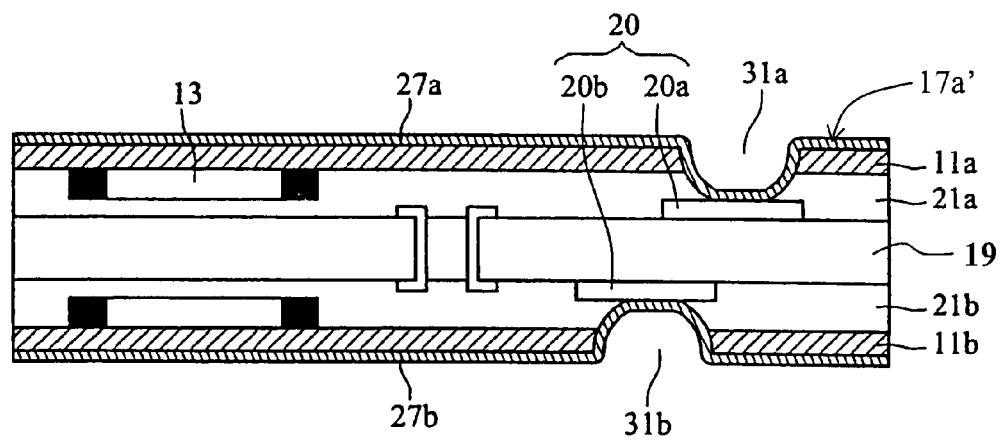
FIG. 4A to FIG. 4B show a second example of a circuit pattern formed on the surface of a deposited multi-layer circuit board.
Figure 4B:
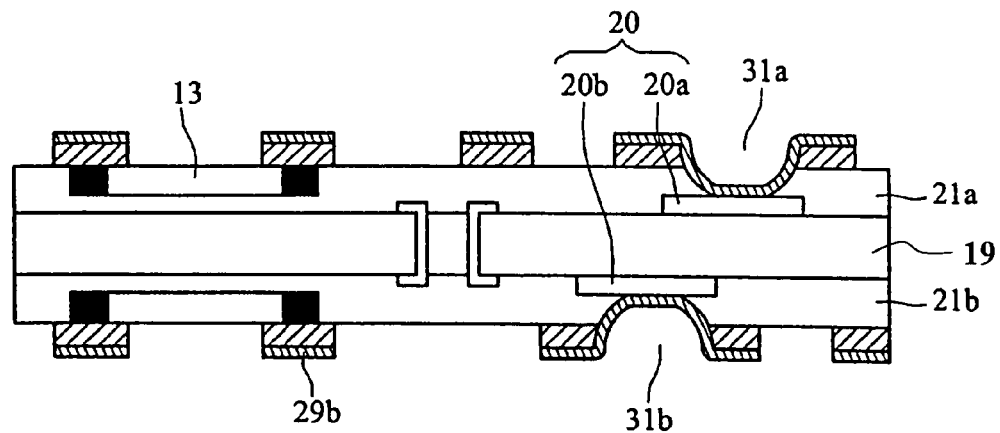

According to FIG. 3B, the electrical pattern is respectively formed on the top and the bottom conductive foils. However, in the practical application, the electrical pattern can be formed on one of the conductive foils only. Besides, if the core substrate 19 of the deposited multi-layer circuit board has an electrical pattern formed on both the top surface and the bottom surface or on either of the top surface and bottom surface, an external electrical pattern electrically connected to the electrical pattern of the core substrate on the outer surface can alternatively be formed. Refer to FIG. 4A and FIG. 4B, which show a second example of a circuit pattern formed on the surface of a deposited multi-layer circuit board.

As shown in FIG. 4A, at least a pair of blind holes (31a, 31b) are formed by hollowing the first conductive foil 11a, the first organic insulation layer 21a, the second conductive foil 11b and the second organic insulation layer 21b which connect the top surface to the bottom surfaces, so that the circuits 20 of the core substrate 19 respectively covered by the organic insulation layer (21a, 21b) are exposed. When a circuit is to be formed on the conductive foil, the circuit can be electrically connected to the circuit 20 of the core substrate 19 covered by organic insulation layer (21a, 21b) via the blind holes (31a, 31b).

Next, a first metal layer 27a and a second metal layer 27b are respectively formed on the top surface and the bottom surface of the multi-layer circuit board 23. The first metal layer 27a covers up the first conductive foil 11a and the inner wall of the blind hole 31a so as to be connected to the circuit 20a disposed on the top surface of the core substrate 19. The second metal layer 27b covers up the second conductive foil 11b and the inner wall of the blind hole 31b disposed on the bottom surface so as to be connected to the circuit 20b disposed on the bottom surface of the core substrate 19. The first metal layer or the second metal layer may include copper.

The formation of the metal layer 27, for example, the formation method of a copper metal layer, can be achieved through chemical vapor deposition such as physical vapor deposition (PVD), chemical vapor deposition (CVD), electroplated copper, non-plated copper, sputtering, evaporation, arc vapor deposition, ion beam sputtering, laser ablation deposition, plasma enhanced chemical vapor deposition (PECVD) or organic metal. It is preferred to use non-plating method first and the plating method comes second in forming the copper metal layer.

As shown in FIG. 4B, the metal layers (27a, 27b) on the top and the bottom surfaces are respectively patterned to form the electrical patterns (29a, 29b) electrically connected the circuit (20a, 20b) disposed on the top and the bottom surfaces of the core substrate 19. The deposited multi-layer circuit board disclosed above can further include a buried hole 39 electrically connected to the blind holes (the connecting path is not shown in the diagram).

In FIG. 4B, the electrical pattern is formed on the top and the bottom surfaces of the core substrate. However, in practical application, the core substrate can have the electrical pattern on one surface only. Despite electrical pattern is formed on the top and the bottom conductive foils in FIG. 4B, in practical application, the electrical pattern can be formed on one of the conductive foils only.

Figure 5:
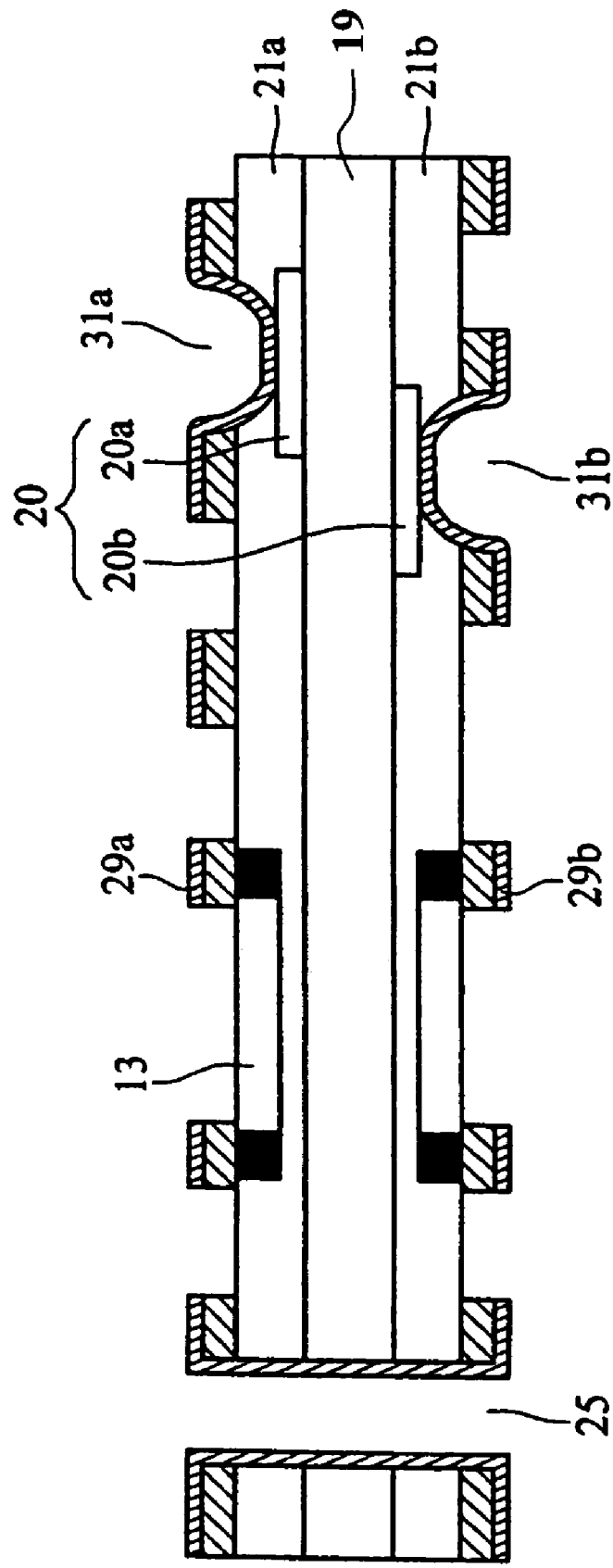
FIG. 5 shows a third example of a circuit pattern formed on the surface of a deposited multi-layer circuit board.

Besides, if that the core substrate 19 of the deposited multilayer circuit board has an electrical pattern formed on both the top surface and the bottom surface or on either of the top surface and bottom surface can alternatively be achieved by forming a blind hole in the manufacturing process of FIG. 3A and FIG. 3B in addition to the above manufacturing process of forming a through hole, an external electrical pattern electrically connected to the electrical pattern of the core substrate via the blind hole is subsequently formed on the outer surface. Referring to FIG. 5, a third example of a circuit pattern formed on the surface of a deposited multi-layer circuit board is shown.

According to the manufacturing method of a multi-layer circuit board embedded with a passive component of the invention disclosed above, the metal protruding points are disposed on the conductive foils and the passive components can be directly mounted onto the metal protruding points via hot-pressing. Therefore, there is no need to consider the printing size of the passive component. Consequently, the complexity in the manufacturing process of forming the passive component is largely reduced, and the objects of simplifying the manufacturing process and enhancing electrical precision are achieved.

Therefore, the manufacturing method of a multi-layer circuit board embedded with a passive component according to the invention provides the user the manufacturing method of a multi-layer circuit board which can be applied to various manufacturing processes without having to consider the ability of the manufacturing process of the resistor or the capacitor as well as the difference between the original design and the manufactured product. The method according to the invention effectively simplifies the manufacturing process and the manufacturing costs as well.

While the invention has been described by way of example and in terms of a preferred embodiment, it is to be understood that the invention is not limited thereto. On the contrary, it is intended to cover various modifications and similar arrangements and procedures, and the scope of the appended claims therefore should be accorded the broadest interpretation so as to encompass all such modifications and similar arrangements and procedures.

What is claimed is:

1. A manufacturing method of a multi-layer circuit board embedded with a passive component, the method comprising the steps of:
   providing a conductive foil which has a first surface and a second surface, the conductive foil has at least a pair of metal protruding points with the same material as the conductive foil disposed on the first surface, the distance between the pair of metal protruding points substantially equal to the distance between the two electrical contacts of the passive component;
   providing the passive component, comprising two electrical contacts at two ends thereof;
   connecting the two electrical contacts of the passive component onto the corresponding metal protruding points of the conductive foil;
   providing a board having a core substrate with organic insulation layer thereon;
   stacking the conductive foil and the board, wherein the passive component is embedded in the organic insulation layer; and
   patterning on the conductive foil;
   wherein the metal protruding points are integral with the conductive foil as a whole.

2. The manufacturing method according to claim 1, wherein the conductive foil is a copper foil.

3. The manufacturing method according to claim 1, wherein the passive component is a capacitor, an inductometer or a resistor.

4. The manufacturing method according to claim 1, wherein the core substrate is a double-layer circuit board.

5. The manufacturing method according to claim 1, wherein the core substrate is a multi-layer circuit board.

6. The manufacturing method according to claim 1, wherein the core substrate is made of an insulating material.

7. The manufacturing method according to claim 1, wherein the organic insulation layer is a pre-preg.

8. The manufacturing method according to claim 1, wherein the organic insulation layer is made of epoxy resin.

9. The manufacturing method according to claim 1, wherein the connecting step is performed by hot-pressing.

10. The manufacturing method according to claim 1, wherein the step of stacking the board and the conductive foil is performed by hot-pressing.

11. The manufacturing method according to claim 1, wherein the forming step comprises:
penetrating the core substrate, the organic insulation layer and the conductive foil to form a through hole;
forming a metal layer on the second surface of the conductive foil and on an inner wall of the through hole; and
patterning the metal layer.

12. The manufacturing method according to claim 11, wherein the metal layer is made of copper.

13. The manufacturing method according to claim 1, wherein the forming step comprises:
penetrating the organic insulation layer and the conductive foil to form a blind hole;
forming a metal layer on the second surface of the conductive foil and on an inner wall of the blind hole; and
patterning the metal layer.

14. The manufacturing method according to claim 13, wherein the metal layer is made of copper.

15. The manufacturing method according to claim 13, wherein the core substrate further has a buried hole electrically connected to the blind hole.

* * * * *